(12) United States Patent
Yamauchi

(10) Patent No.: US 6,392,927 B2
(45) Date of Patent: May 21, 2002

(54) CELL ARRAY, OPERATING METHOD OF THE SAME AND MANUFACTURING METHOD OF THE SAME

(75) Inventor: Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/789,726

(22) Filed: Feb. 22, 2001

(30) Foreign Application Priority Data

Apr. 11, 2000 (JP) ........................................ 2000-109603

(51) Int. Cl.$^7$ ............................................. G11C 16/04
(52) U.S. Cl. ............................ 365/185.14; 365/185.18; 257/315
(58) Field of Search ........................ 365/185.14, 185.18; 257/314, 315

(56) References Cited

U.S. PATENT DOCUMENTS 5,912,843 A * 6/1999 Jeng ........................ 365/185.14
6,104,057 A * 8/2000 Nakanishi et al. .......... 257/314

FOREIGN PATENT DOCUMENTS

JP          5-152579          6/1993

* cited by examiner

*Primary Examiner*—Huan Hoang
(74) *Attorney, Agent, or Firm*—Nixon & Vanderhye, P.C.

(57) ABSTRACT

A cell array comprising nonvolatile memory cells having; a floating gate formed on a semiconductor substrate with the intervention of a first insulating film; a split gate formed with the intervention of a second insulating film at a predetermined distance from the floating gate; a control gate formed at least on the floating gate with the intervention of a third insulating film; and an impurity diffusion layer formed in a surface layer of the semiconductor substrate and capacitively coupled with an edge of the floating gate on an opposite side to the split gate in an X direction in parallel with a channel direction; wherein two or more cells are arranged in matrix along the X direction and a Y direction vertical to the X direction, the floating gates and the split gates are alternately arranged in the X direction and the impurity diffusion layer of one cell is capacitively coupled with a split gate of another cell adjacent to said one cell in the X direction, the control gates of the cells arranged along the X direction are commonly connected along the X direction, the impurity diffusion layers of the cells arranged along the Y direction are commonly connected along the Y direction, and the split gates commonly connected along the Y direction are also commonly connected along the X direction through at least one conductive layer.

21 Claims, 21 Drawing Sheets

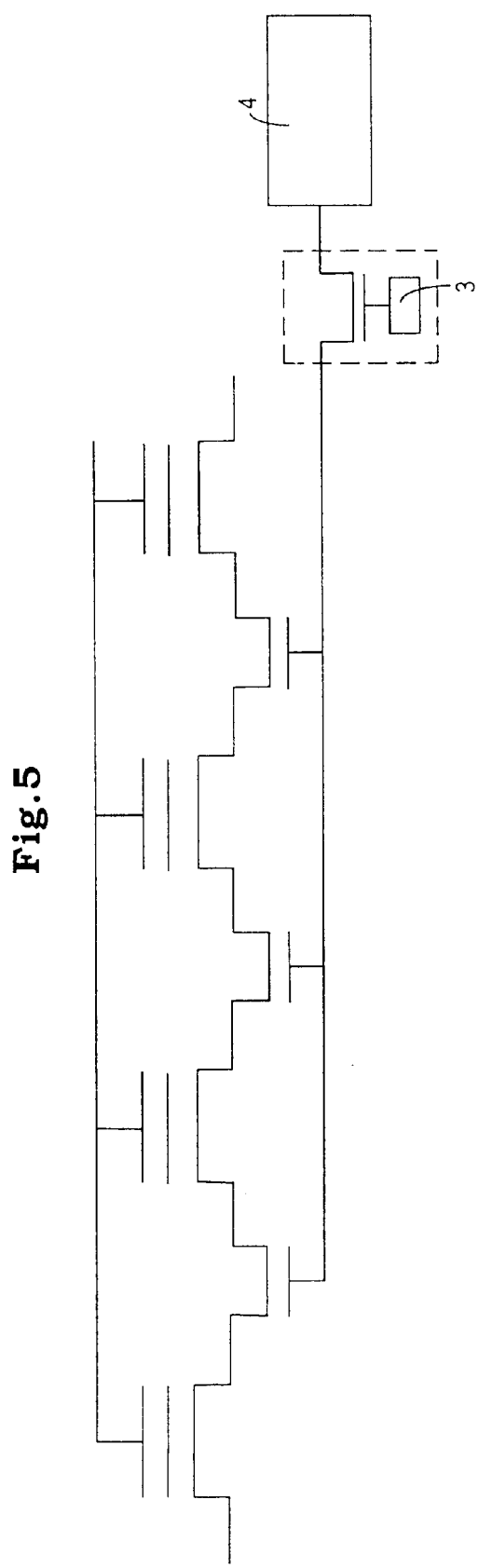

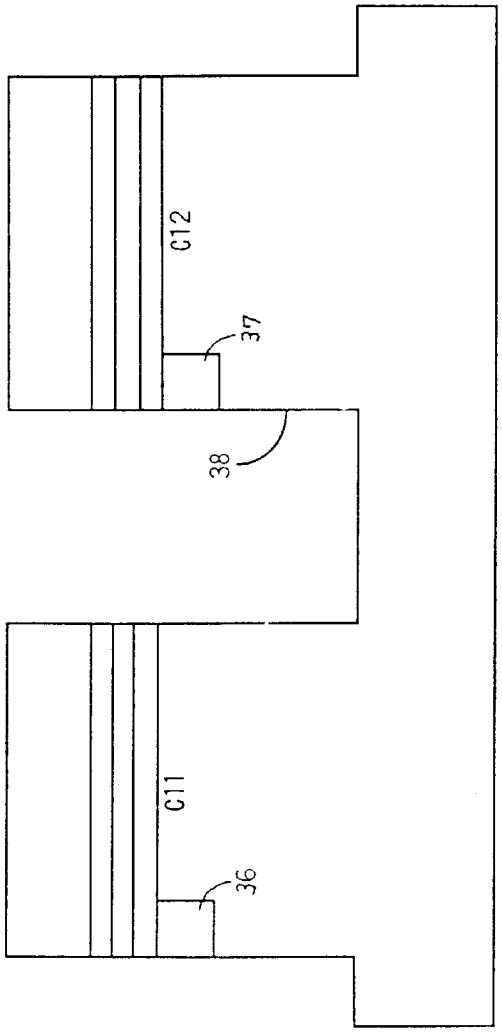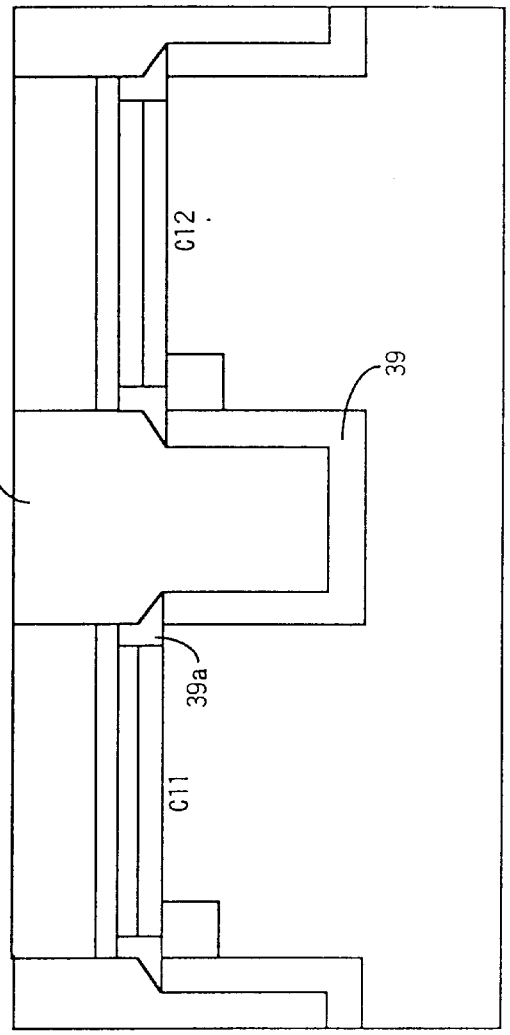

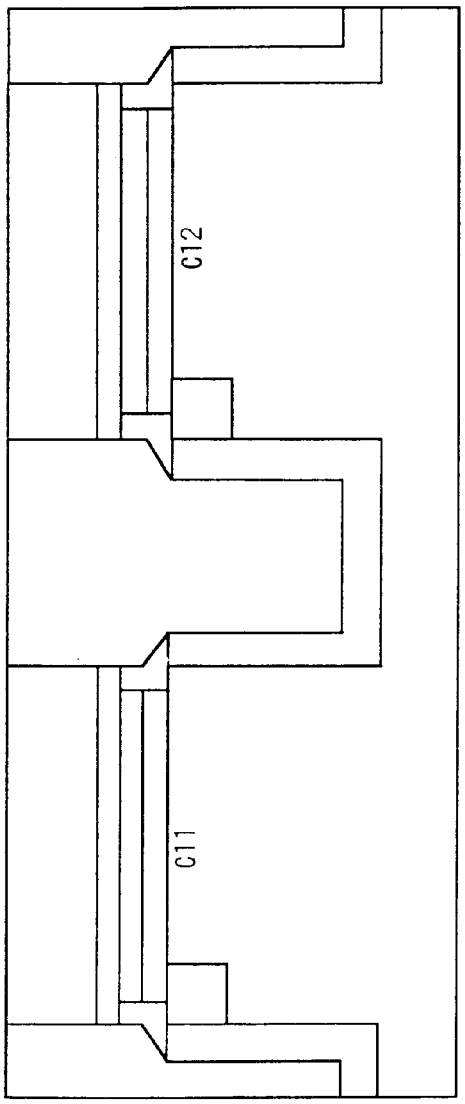
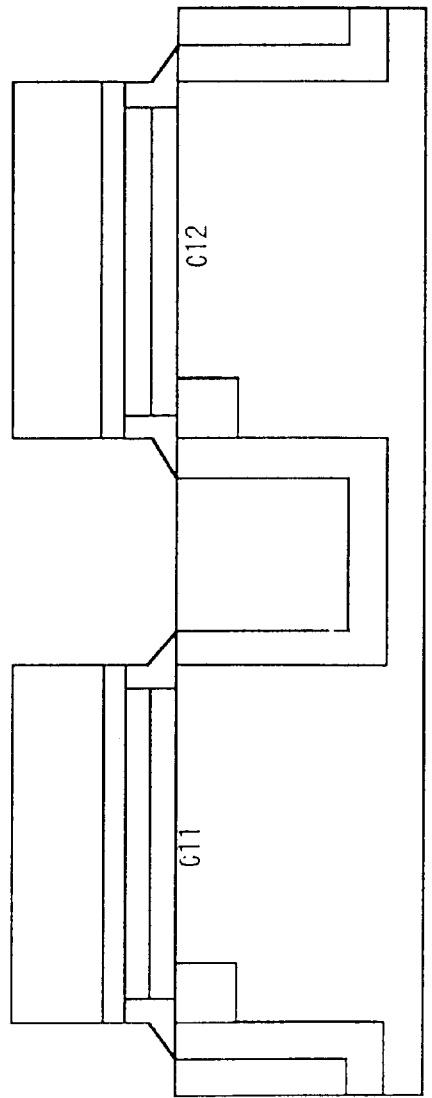

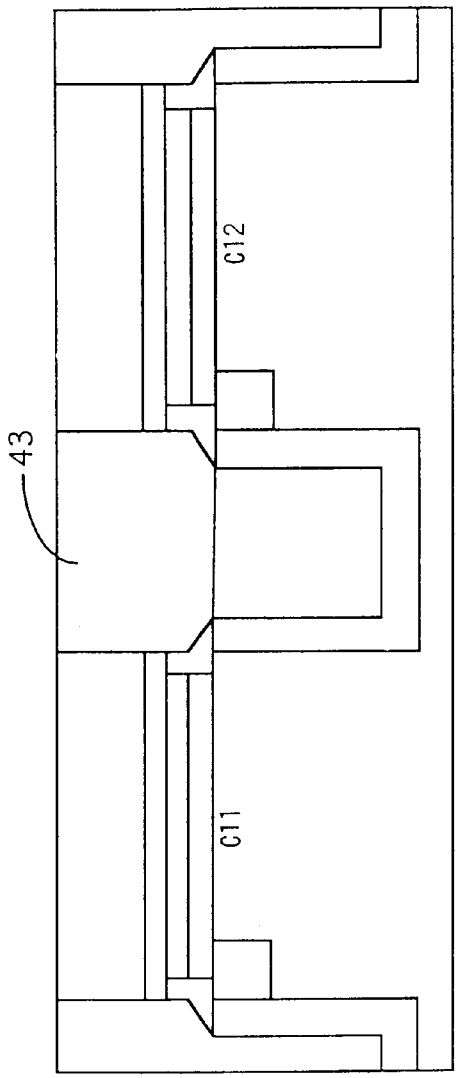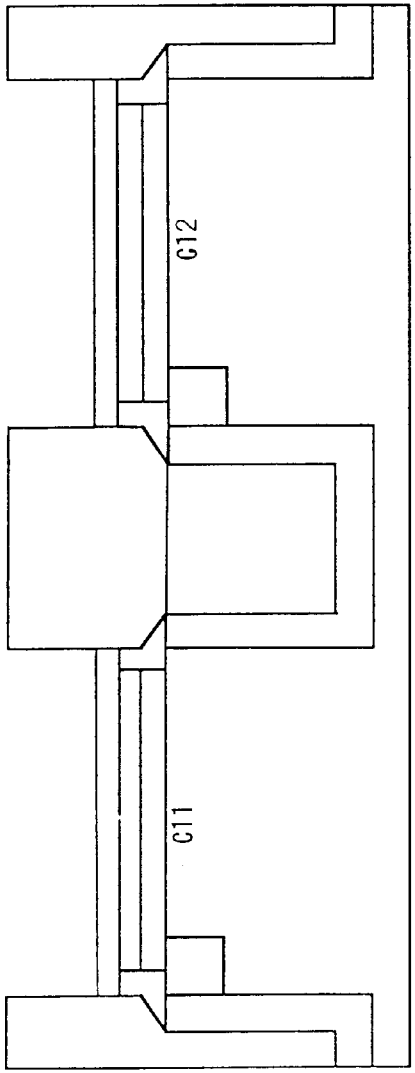

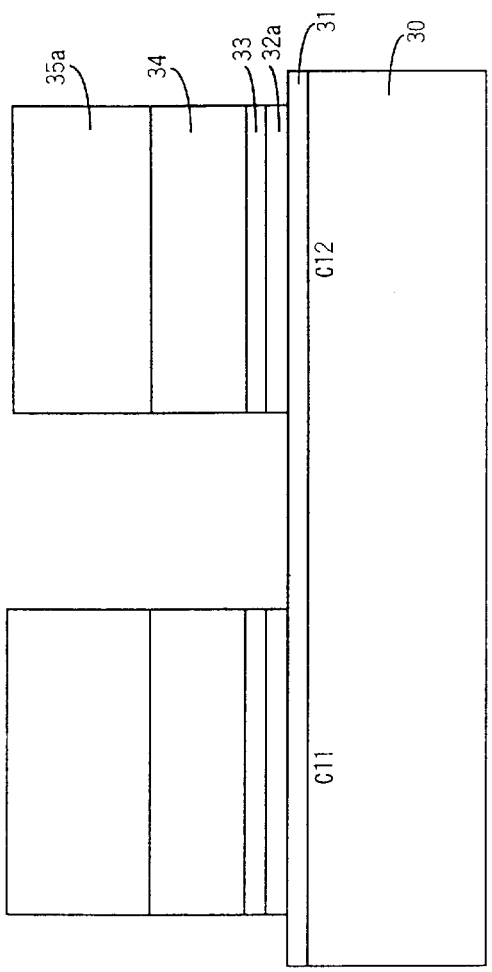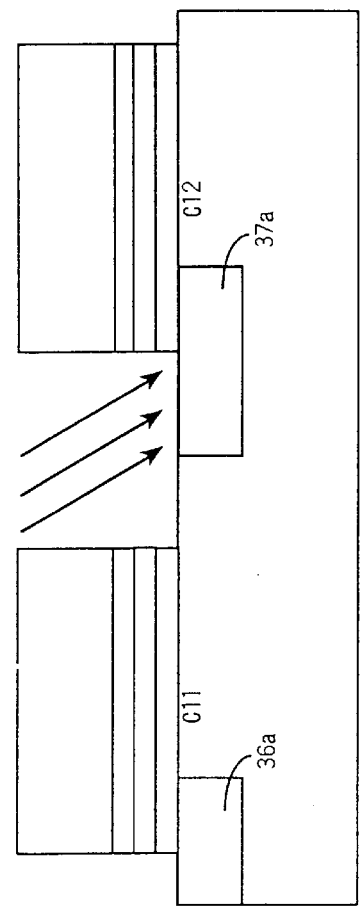

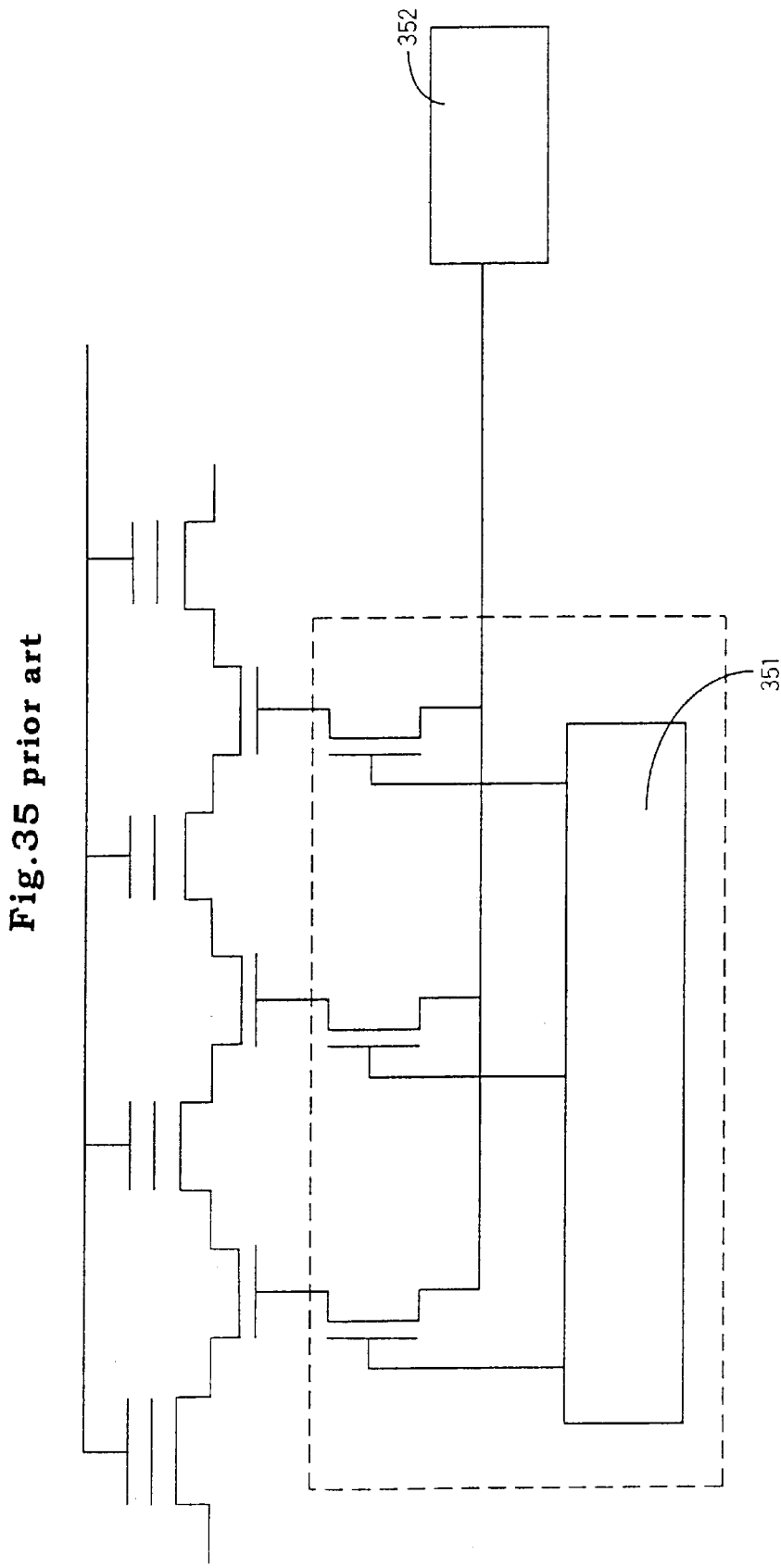

CELL ARRAY, OPERATING METHOD OF THE SAME AND MANUFACTURING METHOD OF THE SAME

CROSS-REFERENCE TO RELATED APPLICATION

This application is related to Japanese application No. 2000-109603 filed on Apr. 11, 2000, whose priority is claimed under 35 USC § 119, the disclosure of which is incorporated by reference in its entirety.

BACKGROUND OF THE INVENTION

1. Field of the Invention

The present invention relates to a cell array, a method of operating the same and a method of manufacturing the same. In particular, it relates to a cell array of virtual grounding structure including cells of split gate (SPG) structure and being capable of high integration, a method of operating the same and a method of manufacturing the same.

2. Description of Related Art

A cell array of virtual grounding structure has been proposed with a view to reducing the size of a cell array provided by integrating nonvolatile memory cells. In the virtual grounding cell array, one bit line can be omitted, because a bit line does not need to contact an impurity diffusion layer which functions as a drain, and a source of a cell can serve as a drain of another cell adjacent to the cell. Therefore, scaling of the cells is easily performed and an area of the cells can be minimized in NOR structures, which is suited to obtain a device of large capacity.

However, in the above-mentioned virtual grounding cell array, it is known that data reading from a cell is often interfered by another cell adjacent to the cell. Accordingly, it has been difficult to achieve satisfactory reading precision and to obtain a multi-valued cell array.

Regarding this drawback, a virtual grounding cell array utilizing cells of SPG structure has been proposed. FIG. 34 shows an equivalent circuit diagram of the virtual grounding cell array. Hereinafter, description is made with respect to this figure.

In FIG. 34, a memory cell 341 is constructed of a SPG transistor 342 and a control gate 343 which are connected in serial. A plurality of memory cells of this type are arranged in matrix along a direction of X parallel to a channel direction (a word line direction: referred simply to as an X direction) and a direction of Y vertical to the channel direction (a bit line direction: referred simply to as a Y direction). Control gates of the cells arranged along the X direction are connected to a common word line (WL) denoted as WL n. Drains, sources and SPGs of the cells arranged in the Y direction have a common connection to bit lines BL1 to BL5, respectively.

However, in the thus constructed cell array, it is required to separately control voltages to be applied to the SPGs (in addition to BL and WL) of the cells arranged in the Y direction. Therefore, even if an area per cell is reduced, there has been the following drawback.

As seen in FIG. 34, the SPGs of the cells are connected in the Y direction. Further, a decoder 351 as a periphery circuit is required to SPGs 1 to 4 controlling the voltage, respectively (see FIG. 35). Reference numeral 352 in FIG. 35 denotes a voltage supply. As a result, scaling of an array area is difficult.

SUMMARY OF THE INVENTION

According to the present invention, provided is a cell array comprising nonvolatile memory cells having:

a floating gate formed on a semiconductor substrate with the intervention of a first insulating film;

a split gate formed with the intervention of a second insulating film at a predetermined distance from the floating gate;

a control gate formed at least on the floating gate with the intervention of a third insulating film; and an impurity diffusion layer formed in a surface layer of the semiconductor substrate and capacitive coupled with an edge of the floating gate on an opposite side to the split gate in an X direction in parallel with a channel direction;

wherein two or more cells are arranged in matrix along the X direction and a Y direction vertical to the X direction, the floating gates and the split gates are alternately arranged in the X direction and the impurity diffusion layer of one cell is capacitive coupled with a split gate of another cell adjacent to said one cell in the X direction, the control gates of the cells arranged along the X direction are commonly connected along the X direction, the impurity diffusion layers of the cells arranged along the Y direction are commonly connected along the Y direction, and the split gates commonly connected along the Y direction are also commonly connected along the X direction through at least one conductive layer.

The present invention also provides a method of operating the above-mentioned cell array.

According to the present invention, provided is a method of manufacturing a nonvolatile semiconductor memory comprising:

(a) forming floating gates for providing a plurality of nonvolatile memory cells on a semiconductor substrate with the intervention of a first insulating film in matrix along an X direction parallel to a channel direction and a Y direction vertical to the X direction with a predetermined distance therebetween in the X and Y directions;

(b) forming a split gate on the semiconductor substrate with the intervention of a second insulating film at least at one side of each of the floating gates in the X direction so that the split gate is commonly connected with the cells arranged in the Y direction;

(c) forming an impurity diffusion layer in a surface layer of the semiconductor substrate between a floating gate of one cell and a split gate of another cell adjacent to said one cell so that the impurity diffusion layer is capacitively coupled with the floating gate of said one cell and the split gate of said another cell and commonly connected with the cells arranged in the Y direction; and (d) forming a control gate on each of the floating gates with the intervention of a third insulating film so that the control gate is commonly connected to the cells arranged in the X direction and simultaneously forming at least one conductive layer so that the split gates commonly connected along the Y direction are also commonly connected in the X direction.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 5 is an equivalent circuit diagram of cell array according to the present invention including a periphery circuit;

FIG. 9 is a schematic sectional view illustrating manufacturing steps of the cell array according to Embodiment 1 of the present invention;

FIG. 10 is a schematic sectional view illustrating steps of a manufacturing method of the memory cell according to Embodiment 1 of the present invention;

FIG. 11 is a schematic sectional view illustrating steps of a manufacturing method of the memory cell according to Embodiment 1 of the present invention;

FIG. 12 is a schematic sectional view illustrating steps of a manufacturing method of the memory cell according to Embodiment 1 of the present invention;

FIG. 13 is a schematic sectional view illustrating steps of a manufacturing method of the memory cell according to Embodiment 1 of the present invention;

FIG. 14 is a schematic sectional view illustrating steps of a manufacturing method of the memory cell according to Embodiment 1 of the present invention;

FIG. 20 is a schematic sectional view illustrating steps of a manufacturing method of the memory cell according to Embodiment 1 of the present invention;

FIG. 21 is a schematic sectional view illustrating steps of a manufacturing method of the memory cell according to Embodiment 1 of the present invention;

FIG. 35 is an equivalent circuit diagram of the cell array according to the prior art including a periphery circuit.

DESCRIPTION OF THE PREFERRED EMBODIMENTS

According to the present invention as descried above, provided is a cell array capable of data writing, reading and rewriting without causing any problems even if the voltage to be applied to each of the SPGs is not controlled. Further, the number of the decoders for the SPGs is reduced and thus an area of the cell array is reduced. As a result, a cell array of large capacity is provided.

Still further, data rewriting to the cells composed the cell array of the present invention is performed with use of FN tunnel current or CHE. Therefore, a cell array constructed of highly reliable nonvolatile memory cells capable of high-speed data writing is provided.

Hereinafter, the present invention will be described in further detail, but the invention is not limited thereto.

Figure 1:
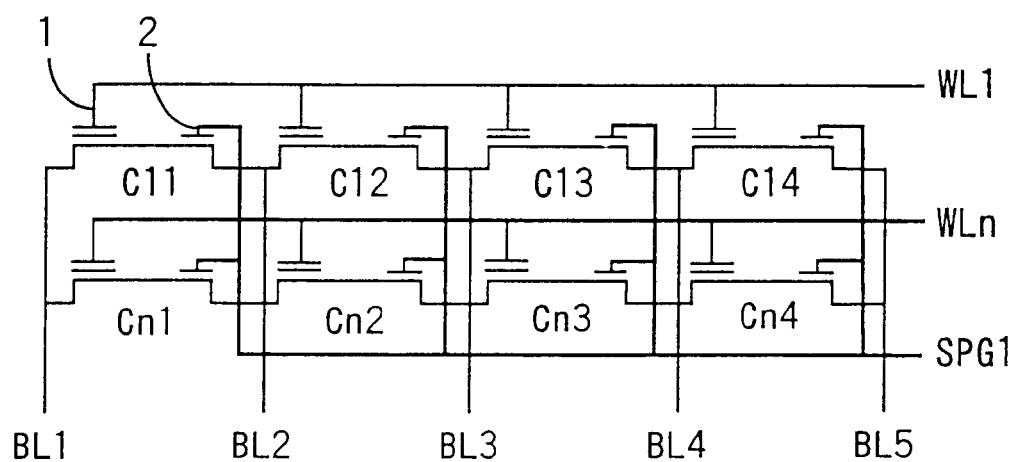
FIG. 1 is an equivalent circuit diagram of a cell array according to Embodiment 1 of the present invention.
Figure 2:
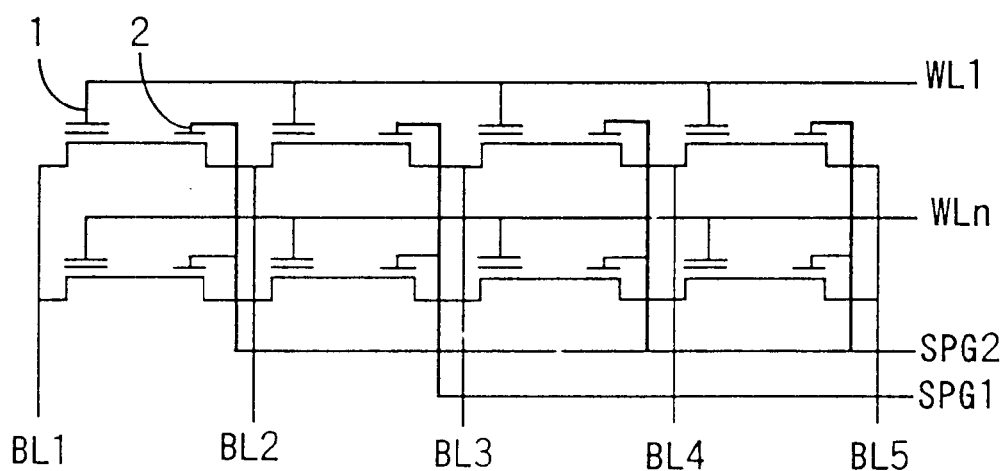
FIG. 2 is an equivalent circuit diagram of a cell array according to Embodiment 2 of the present invention.
Figure 3:
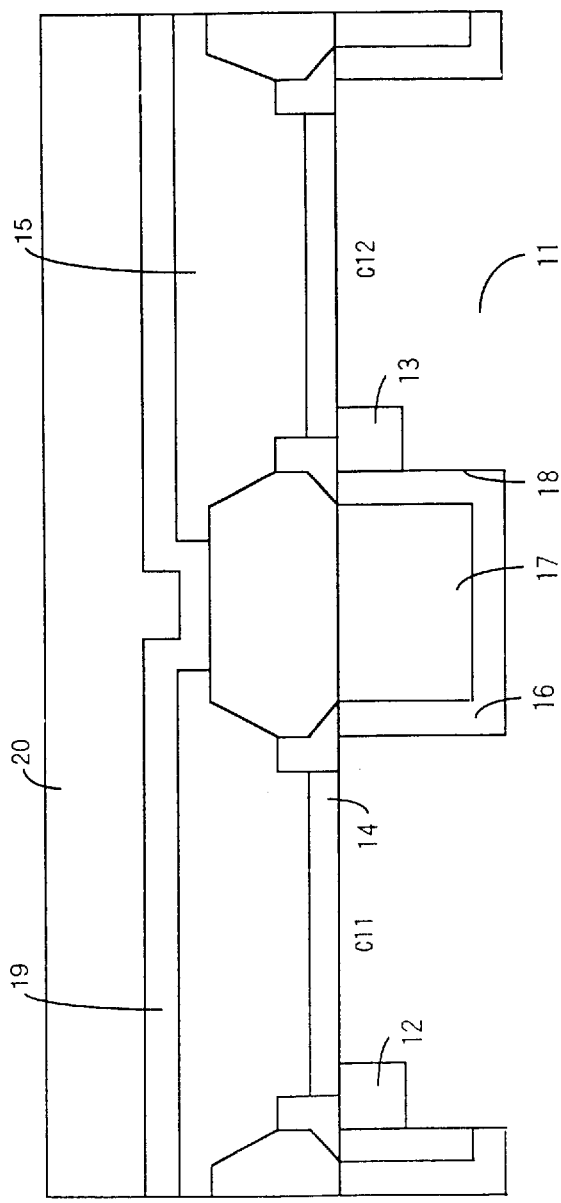
FIG. 3 is a schematic sectional view of a cell composed a cell array of the present invention.
Figure 4:
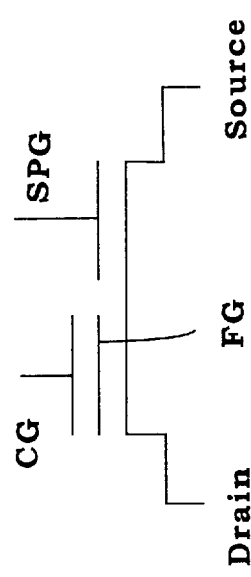
FIG. 4 is an equivalent circuit diagram of the cell shown in FIG. 3.

FIG. 1 is an equivalent circuit diagram of a cell array according to Embodiment 1 and FIG. 2 is the same according to Embodiment 2. In the cell arrays shown in FIGS. 1 and 2, a plurality of cells constructed as shown in FIG. 3 are arranged in matrix along the directions of X and Y. The cells are connected in serial along the X direction. FIG. 4 shows an equivalent circuit diagram of the memory cell shown in FIG. 3.

Now, further description is given to FIGS. 1 and 2. Control gates 1 of memory cells C11, C12, C13 and C14 are connected to a common WL 1. Impurity diffusion layers which function as sources or drains of memory cells Cn1, Cn2, Cn3 and Cn4 (n is an integer not less than 1) are connected to BLs 1 to 5 extending along the Y direction, respectively. The SPGs are commonly connected along the Y direction. In the figures, reference numeral 2 denotes a SPG transistor.

The connection of the SPGs along the Y direction is established through at least one common conductive layer so as to equalize electrical potentials of the SPGs in the X direction.

In the cell array according to Embodiment 1 shown in FIG. 1, all the SPGs are connected to a common conductive layer SPG 1. In the cell array according to Embodiment 2 shown in FIG. 2, the SPGs are connected to two conductive layers SPG 1 and SPG 2 alternately on a column basis. According to such a construction, the number of decorders 3 as peripheral circuits which have been required for every SPG is reduced as seen in FIG. 5. Reference numeral 4 in FIG. 5 denotes a voltage supply.

In the cell array constructed as shown in FIG. 2, it is possible to apply different voltages to the cells adjacent to each other on the same WL.

Conditions for data reading from the cell arrays of FIGS. 1 and 2 are shown in Table 1 and those for data writing are shown in Table 2. The following conditions are merely described as an example and do not limit the present invention.

Simultaneously, a voltage of 1V is applied to the BL3 connected with an impurity diffusion layer which serves as a source of the selected cell C12, and the BL2 connected with an impurity diffusion layer which serves as a drain of the C12 is grounded. Further, a voltage of 3V is applied to the selected WL 1. The memory cell is in an OFF-state when a threshold value of a transistor below the control gate is 3V or more and is in an ON-state when the threshold value is less than 3V. Thus, data reading from the selected cell is performed.

In this case, for preventing leak current to unselected cells adjacent to the selected cell C12, a voltage of 1V is applied to the BL 4 and the BL 5 of the unselected cells C13 and C14 adjacent to one side of the C12, and the BL 1 of the unselected cell C11 adjacent to another side of the C12 is grounded.

Further, as indicated in parentheses in READ 1 of Table 1, the data reading as described above can be performed even if the BL3 connected with the impurity diffusion layer which functions as the source of the selected cell C12 is grounded and a voltage of 1V is applied to the BL2 connected with the impurity diffusion layer which serves as the drain.

1-2) Cell Array of FIG. 2

(a) Where C12 is a selected cell, a voltage of 3V, which is higher than a threshold voltage of the SPG transistor, is applied to the SPG 1 and the SPG 2 as indicated in READ 2 of Table 1. Other operation conditions are the same as in READ 1. Thus, data reading from the selected cell C12 is performed.

(b) Where the memory cells C12 and C14 are selected, the SPG 2 connected with the SPGs of unselected adjacent

TABLE 1

| Reading | Influence by adjacent cells | | WL1 | WL2 | BL1 | BL2 | BL3 | BL4 | BL5 | SPG1 | SPG2 | Substrate |
|---|---|---|---|---|---|---|---|---|---|---|---|---|
| READ 1 | Caused | | 3V | 0 | 0(1)V | 0(1)V | 1(0)V | 1(0)V | 1(0)V | 3V | — | 0 |
| READ 2 | | | 3V | 0 | 0(1)V | 0(1)V | 1(0)V | 1(0)V | 1(0)V | 3V | 3V | 0 |
| READ 3 | Not | Cycle 1 | 3V | 0 | 1(0)V | 0(1)V | 1(0)V | 0(1)V | 1(0)V | 3V | 0 | 0 |
| | caused | Cycle 2 | 3V | 0 | 0(1)V | 1(0)V | 0(1)V | 1(0)V | 0(1)V | 0 | 3V | 0 |

TABLE 2

| Writing | Structure | | WL1 | WL2 | BL1 | BL2 | BL3 | BL4 | BL5 | SPG1 | SPG2 | substrate |
|---|---|---|---|---|---|---|---|---|---|---|---|---|
| WRITE 1 | FN | | 20V | 0 | 6V | 0 | 6V | 6V | 6V | 0 | — | 0 |
| | | | 20V | 0 | 6V | 0 | 6V | 6V | 6V | 0 | 0 | 0 |
| WRITE 2 | CHE | | 12V | 0 | 0 | 4V | 0 | 0 | 0 | 2V | — | 0 |
| | | | 12V | 0 | 0 | 4V | 0 | 0 | 0 | 2V | 2V | 0 |
| WRITE 3 | | Cycle 1 | 12V | 0 | 0 | 4V | 0 | 4V | 0 | 2V | 0 | 0 |
| | | Cycle 2 | 12V | 0 | 4V | 0 | 4V | 0 | 0 | 0 | 2V | 0 |
| WRITE 4 | FN | | −12V | 0 | 0 | 4V | 0 | 0 | 0 | 0 | — | 0 |
| | | | −12V | 0 | 0 | 4V | 0 | 0 | 0 | 0 | 0 | 0 |
| WRITE 5 | CHE | | 12V | 0 | 0 | 5V | 0 | 0 | 0 | 8V | — | 0 |
| | | | 12V | 0 | 0 | 5V | 0 | 0 | 0 | 8V | 8V | 0 |
| WRITE 6 | | Cycle 1 | 12V | 0 | 0 | 5V | 0 | 5V | 0 | 8V | 0 | 0 |
| | | Cycle 2 | 12V | 0 | 5V | 0 | 5V | 0 | 0 | 0 | 8V | 0 |
| ERASE 1 | FN | | −14V | 0 | 6V | 6V | 6V | 6V | 6V | 0 | 0 | 6V |
| ERASE 2 | | | −12V | 0 | 4V | 4V | 4V | 4V | 4V | 0 | 0 | 0 |

Hereinafter, an operation method according to the present invention will be mentioned.

1) Reading 1-1) Cell Array of FIG. 1

Where C12 is a selected cell, a voltage of 3V which is higher than a threshold voltage of the SPG transistor is applied to the SPG 1, i.e., the conductive layer connected with all the cells, as indicated in READ 1 of Table 1.

cells C11 and C13 is grounded to turn the unselected cells OFF as indicated in READ 3 in Table 1. Thus, data is simultaneously read from the cells C12 and C14.

In this case, voltage application to the BL for preventing erroneous reading of the unselected cells as performed in the above case is not required. That is, all the cells on the WL are read by two cycles of CYCLE 1 and CYCLE 2. Therefore the method is suited for high-speed data reading.

Further, this method is not influenced by the adjacent cells, which allows accurate reading of the condition of the transistor below the control gate of the selected cell. This is advantageous to obtain a multi-valued cell array.

2) Writing 2-1) Writing with use of FN Tunnel Current Through a Channel

Writing mechanisms in the equivalent circuit diagrams of FIGS. 1 and 2 are indicated in an upper column and a lower column of WRITE 1 in Table 2, respectively.

The SPG1 in FIG. 1, the SPGs 1 and 2 and the substrate in FIG. 2 are grounded to turn the memory cells OFF. Then a voltage of 20V is applied to the WL1 to which the selected cell C12 is connected so that the channel regions under the control gates of all the cells connected through the WL1 are strongly inverted. Further, the BL2 connected to the selected cell C12 is grounded to apply a high electric field of 10 MV/cm or more between the floating gate and the channel. As a result, electrons are tunneled from the substrate to the floating gate and a threshold value of the transistor under the control gate is increased, thereby the data writing is carried out.

In this case, it is preferable to apply a voltage of 6V to the BLs 1 and 3 to 5 of the unselected cells to prevent the electron tunneling due to the application of the high electric field as mentioned above.

2-2) Writing by Hot Electron Injection From the Impurity Diffusion Layer Which Functions as a Source Writing mechanisms in the equivalent circuit diagrams of FIGS. 1 and 2 are indicated in WRITE 2 and WRITE 3 of Table 2, respectively.

A voltage of 2V, which is close to the threshold value of the SPG transistors, is applied to the SPG 1 in FIG. 1 and the SPGs 1 and 2 in FIG. 2 so that the channel regions of the SPG transistors are weakly inverted.

Then, a voltage of 12V is applied to the WL1 connected to the selected cell C12. Simultaneously, a voltage of 4V is applied to the BL2 and then the BL3 is grounded. Then, hot electrons are injected from the weakly inverted channel region under the SPG transistor to the floating gate, the threshold value of the transistor under the control gate is increased, and thus the data writing is carried out. In this case, for preventing erroneous writing to the unselected cells, it is preferable to apply a voltage to the adjacent impurity diffusion layers to equalize electric potentials thereof.

Further, in the case of FIG. 2, data writing is performed to the selected cells C12 and C14 simultaneously by grounding the SPG2 commonly connected to the SPGs of the unselected cells to turn the unselected cells OFF. In this case, voltage application to the BL for preventing erroneous writing to the unselected cells as performed in the above case is not required. That is, data writing to all the cells on the WL is performed by two cycles of CYCLE 1 and CYCLE 2. This is suited for high-speed data writing.

2-3) Writing with use of Tunnel Current Through an Overlapping Portion Between the Impurity Diffusion Layer as a Drain and the Floating Gate Writing mechanism in the equivalent circuit diagram of FIG. 2 is indicated in WRITE 4 of Table 2.

The SPGs 1 and 2 are grounded to turn the memory cells OFF and a voltage of -12V is applied to the WL1 so that electrons are accumulated in the channel regions under the control gates.

Then a voltage of 4V is applied to the BL2 to which the selected cell C12 is connected. A high electric field of 10 MV/cm or more is applied between the floating gate and the channel region. As a result, electrons are tunneled from the substrate to the floating gate, the threshold voltage of the transistor below the control gate is lowered and thus the data writing is performed.

The BLs 1 and 3 to 5 of the unselected cells are grounded to prevent the application of the high electric field and the resulting electron tunneling.

As mentioned above, the operation method of the present invention allows data writing at a low threshold value, though the method of the prior art performs the data writing at a high threshold voltage. Further, the combination of writing mechanisms as described above allows data writing per byte as performed in EEPROM.

2-4) Writing by Hot Electron Injection From the Impurity Diffusion Layer as a Drain Writing mechanisms in the cell arrays of FIGS. 1 and 2 are indicated in WRITE 5 and WRITE 6 in Table 2, respectively.

A voltage of 8V is applied to the SPG 1 in FIG. 1, the SPGs 1 and 2 in FIG. 2 so that the channel regions under the SPG transistors are strongly inverted.

Then, a voltage of 12V is applied to the WL1 connected to the selected cell C12. Simultaneously, a voltage of 5V is applied to the BL2, and the BL3 is grounded. As a result, hot electrons with high energy are generated in the drain region and injected to the floating gate, thereby performing the data writing. In this stage, for preventing erroneous writing to the unselected cells, it is preferable to apply a voltage to the adjacent impurity diffusion layers to equalize electric potentials thereof.

In FIG. 2, where C12 and C14 are the selected cells, the SPG2 commonly connected with the SPGs of the unselected cells is grounded to turn the unselected cells OFF and a voltage of 8V is applied to the SPG1 connected to the selected cell to provide strongly inverted state as indicated in WRITE 6 of Table 2. As a result, hot electrons are injected from the impurity diffusion layers which serves as drains of the selected cells C12 and C14 to the floating gates, thereby the data writing to the cells is simultaneously performed. In this case, the voltage application to the BL for preventing the erroneous writing to the unselected cells as performed in the above case is not required. Therefore, data writing to all the cells on the WL is performed by two cycles of CYCLE 1 and CYCLE 2.

Next, the structures of the cell arrays of FIGS. 1 and 2 will be described in Embodiments 1 and 2, respectively.

Embodiment 1

The cell array of FIG. 1 is constructed of a plurality of cells shown in FIG. 3, for example. In the memory cell of FIG. 3, trenches 18 are formed in a semiconductor (silicon) substrate 11 of a first conductivity type (N or P) and impurity diffusion layers 12 and 13 of a second conductivity type (P or N) are formed on a sidewall of the trenches 18. A SPG 17 of polysilicon is buried in each of the trenches 18 with the intervention of a gate oxide film 16 of $SiO_2$ (a first insulating film). On a flat surface of the semiconductor substrate 11 between the trenches 18 a floating gate 15 of polysilicon is formed with the intervention of a tunnel oxide film 14 (a second insulating film), and a control gate 20 is formed on the floating gate with the intervention of a third insulating film of an ONO film 19.

The first, second and third insulating films may be formed of other materials than the above, such as an oxide film, a nitride film or a layered structure of these films. The memory cell itself may be formed in a well.

The impurity diffusion layer 12 functions as a source of a cell and as a drain of another cell adjacent to the cell.

An area of the memory cell is calculated as follows.

The size of the memory cell in the X direction is the sum of the length F of a portion where the floating gate is located and the length F of a portion where the buried SPG is located. That is, the size in the X direction is 2F. The size of the memory cell in the Y direction is the sum of the length F of a portion where the floating gate and the control gate overlap with each other and the length F of a clearance isolating the memory cells. That is, the size of the memory cell in the Y direction is 2F. Accordingly, an area of the memory cell of FIG. 3 is $4F^2$, which is an actual minimum value, is obtained.

In the cell which constructs the cell array of the present invention, the SPG is formed in the trench. However, it may be possible to form the SPG on the semiconductor substrate without providing the trench. In this case, the memory cell area becomes larger than the case where the SPG is formed in the trench.

Further, the width of the impurity diffusion layer may be increased by providing sidewall spacers on the sidewalls of the floating gate. A floating impurity diffusion layer may be provided between the floating gate and the SPG in a single cell.

Figure 6B:
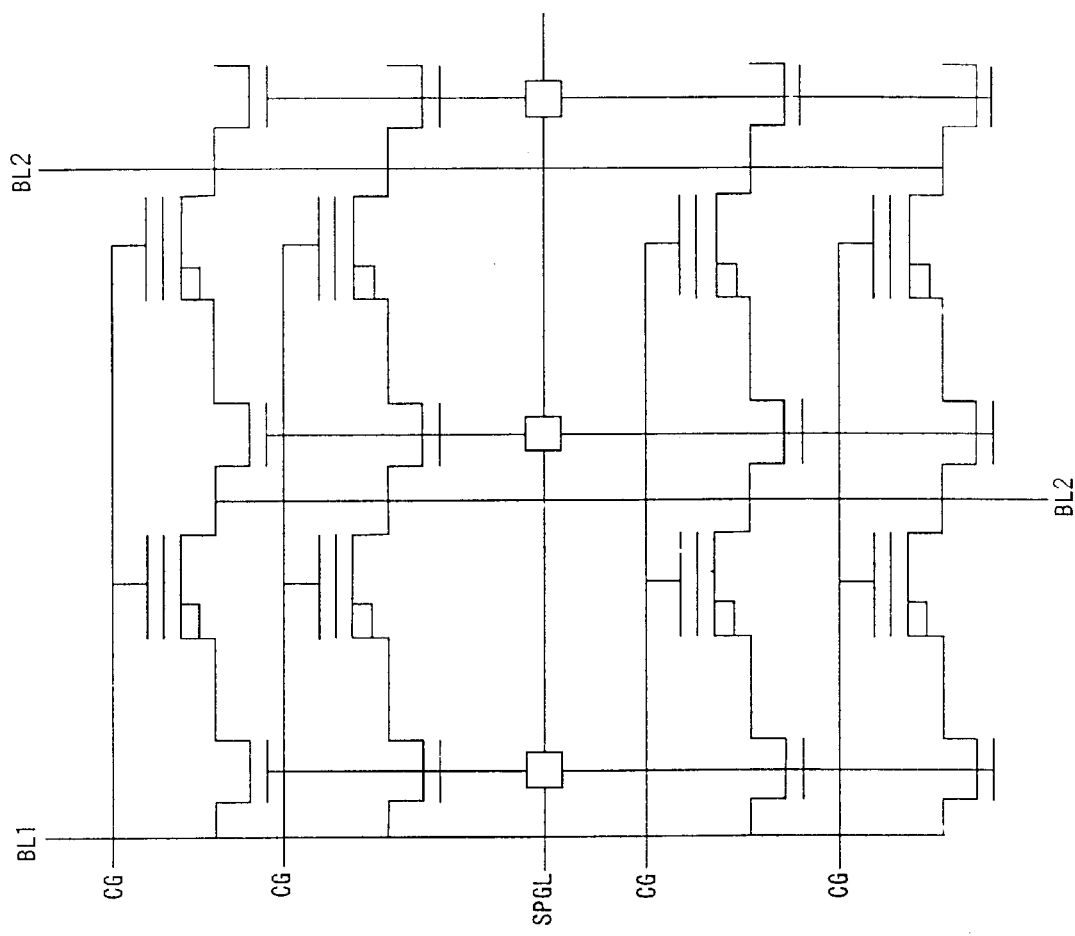
FIGS. 6(a) and 6(b) are a schematic plan view and an equivalent circuit diagram of the cell array according to Embodiment 1 of the present invention, respectively.
Figure 6A:
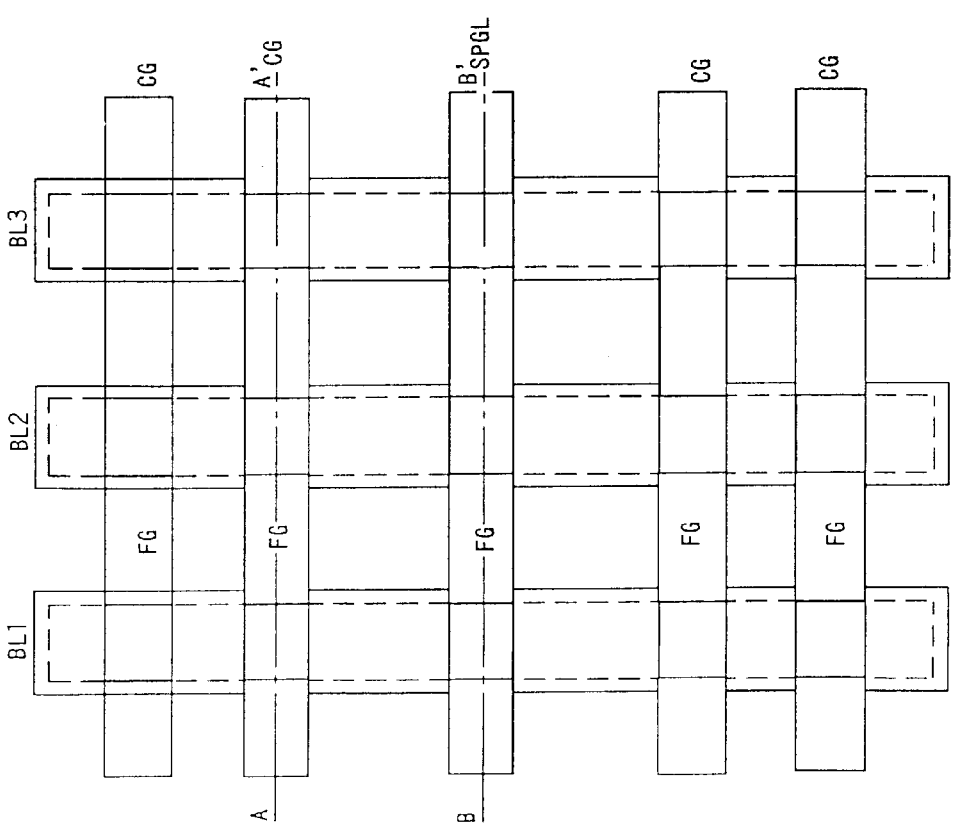
Figure 7:
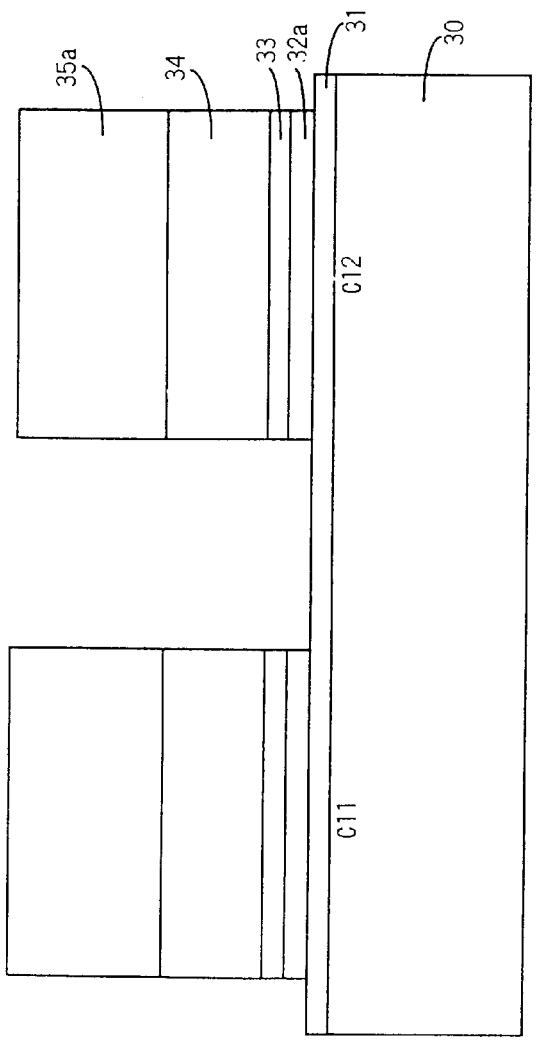
FIG. 7 is a schematic sectional view illustrating manufacturing steps of the cell array according to Embodiment 1 of the present invention.
Figure 8:
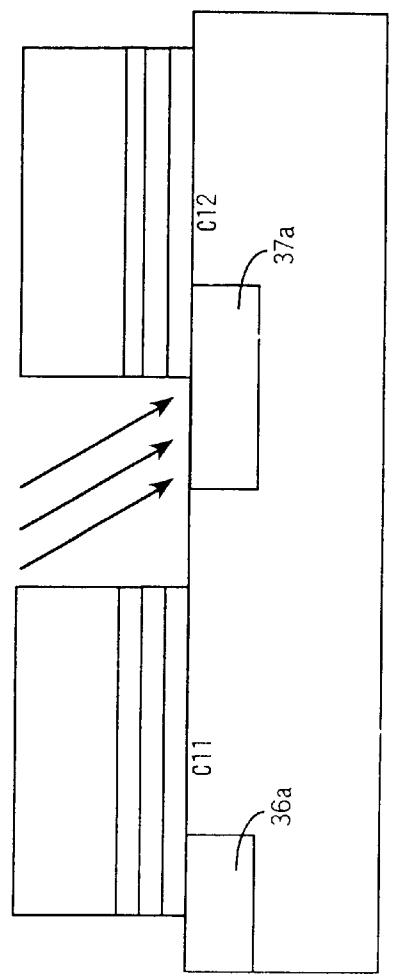
FIG. 8 is a schematic sectional view illustrating manufacturing steps of the cell array according to Embodiment 1 of the present invention.
Figure 15:
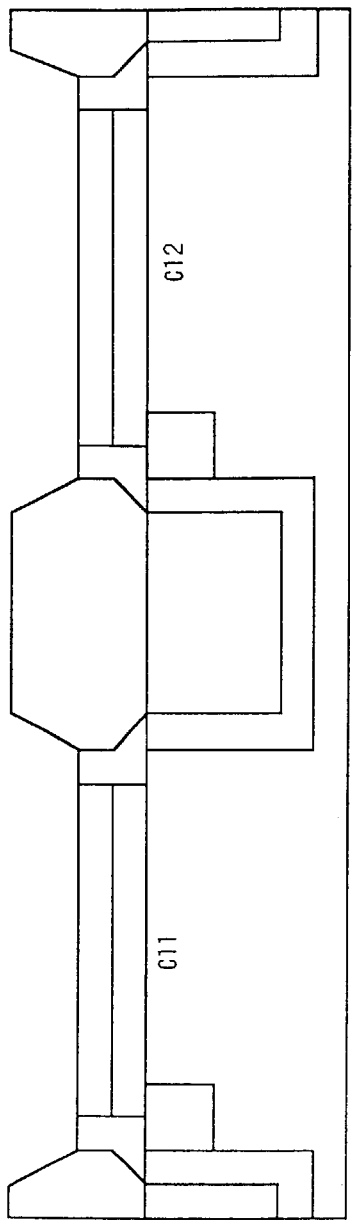
FIG. 15 is a schematic sectional view illustrating steps of a manufacturing method of the memory cell according to Embodiment 1 of the present invention.
Figure 16:
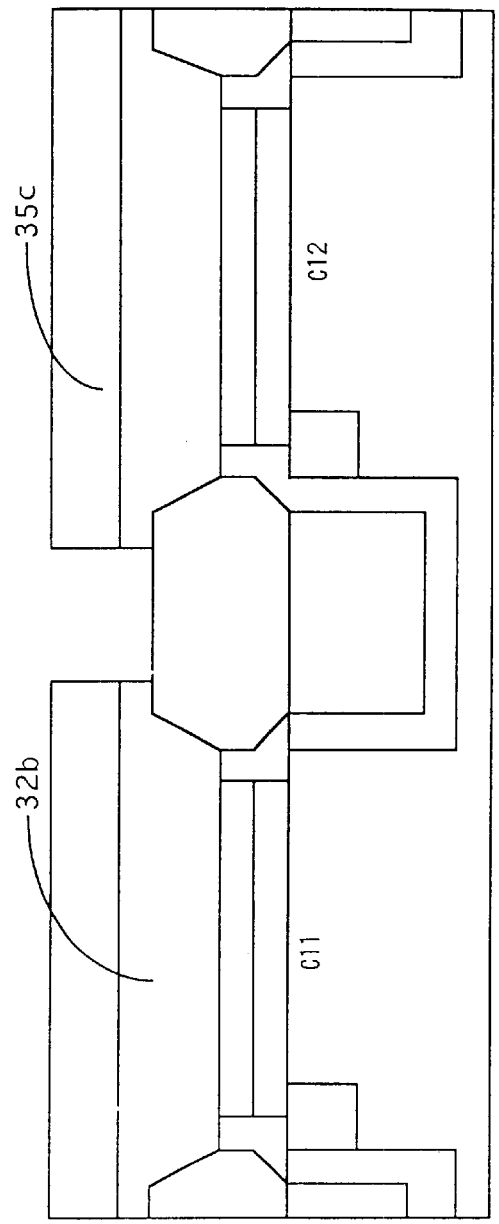
FIG. 16 is a schematic sectional view illustrating steps of a manufacturing method of the memory cell according to Embodiment 1 of the present invention.

FIGS. 6(a) and 6(b) are one example of a schematic plan view and an equivalent circuit diagram of the cell array shown in FIG. 1, respectively. In the cell array shown in FIG. 6(a), SPGs of the whole cells are connected to apply the same voltage to them, as seen in the equivalent circuit diagram of FIG. 6(b).

Now description is given to a method of manufacturing the memory cells composed the above cell array with reference to FIGS. 7 to 19 and 20 to 32. FIGS. 7 to 19 are sectional views illustrating the manufacturing steps of the memory cell cut along a line A–A' shown in FIG. 6(a). FIGS. 20 to 32 are sectional views illustrating the manufacturing steps of the memory cell cut along a line B–B' shown in FIG. 6(a).

First, a tunnel oxide film 31 of 3–10 nm thick (e.g., 9 nm) is formed by thermal oxidation on a semiconductor substrate 30 of a first conductivity type. Then, a polysilicon layer 32a of 10–200 nm thick (e.g., 50 nm), an oxide film 33 of 5–50 nm thick (e.g., 20 nm) and a nitride film 34 of 10–500 nm (e.g., 200 nm) are deposited in sequence over the tunnel oxide film 31. A resist mask 35a is formed thereon to remove predetermined portions of the nitride film 34, the oxide film 33 and the polysilicon layer 32a by etching (see FIGS. 7 and 20).

After the resist mask 35a is removed, a predetermined portion of the tunnel oxide film 31 is etched away using the nitride film 34 as a mask. Thereafter, oblique ion implantation of As, for example, is performed to form impurity diffusion layers 36a and 37a each overlapping with the polysilicon layer 32a at least at one side in the X direction to obtain an offset structure (see FIGS. 8 and 21).

The oblique ion implantation is carried out with an accelerating voltage of 5–30 kev (e.g., 15 kev) and an implantation amount of $1\times10^{13}$ to $1\times10^{16}$ cm$^{-2}$ (e.g., $1\times10^{14}$ cm$^{-2}$).

Then, a thermal treatment is performed at 600–1100° C. (e.g., 800° C.) for re-crystallization of the implanted region. In this embodiment, a layered film of the oxide film and the nitride film is used as the insulating film on the polysilicon layer 32a, but the nitride film may solely be used.

Using the nitride film 34 as a mask, the semiconductor substrate is etched to form a trench 38. Through this step, the impurity diffusion layers 36a and 37a remain only in regions overlapping with the gate and serve as the impurity diffusion layers 36 and 37, respectively (see FIGS. 9 and 22).

The surface of the trench 38 is thermally oxidized to form a gate oxide film 39, and then a polysilicon layer 40 is deposited to bury the trench 38 (e.g., to a thickness of 100 nm). Thereafter, the surface is planarized by CMP (see FIGS. 10 and 23). At the formation of the gate oxide film 39, insulating portions 39a are formed on the sidewalls of the polysilicon layer 32a. The insulating portions 39a prevent leak current between the floating gate and the SPG.

Subsequently, an oxide film 41 and a nitride film 42 are deposited and a resist mask 35b which covers a region for forming a conductive layer commonly connecting the SPGs and opens in a region for forming the memory cell is formed. Using the resist mask 35b, the oxide film 41 and the nitride film 42 on the region for forming the memory cell are removed (see FIGS. 11 and 24).

Thereafter, the polysilicon layer 40 exposed in the region for forming the memory cell is etched back so that the level of the remaining polysilicon layer 40 will preferably be equal to or lower than that of the semiconductor substrate 30 (see FIG. 12). The polysilicon layer 40 in the region for forming the conductive layer is not etched back because it is covered with the oxide film 41 and the nitride film 42 (see FIG. 25). Through this step, a SPG made of the polysilicon layer 40 is provided.

Then, the surface of the SPG is thermally oxidized at 600–1100°C. (e.g., 800° C.) and a HDP oxide film (an insulating film) 43 is deposited. Then the HDP oxide film on the nitride film 34 is removed by CMP or etch back (see FIG. 13). In this stage, the nitride film 34 functions as an etch stopper. The removal of the HDP oxide film may be performed by wet etching in place of CMP and etch back. In the region for forming the conductive layer, the nitride film 42 serves as an etch stopper so that no difference is caused as compared with FIG. 25 (see FIG. 26).

Figure 27:
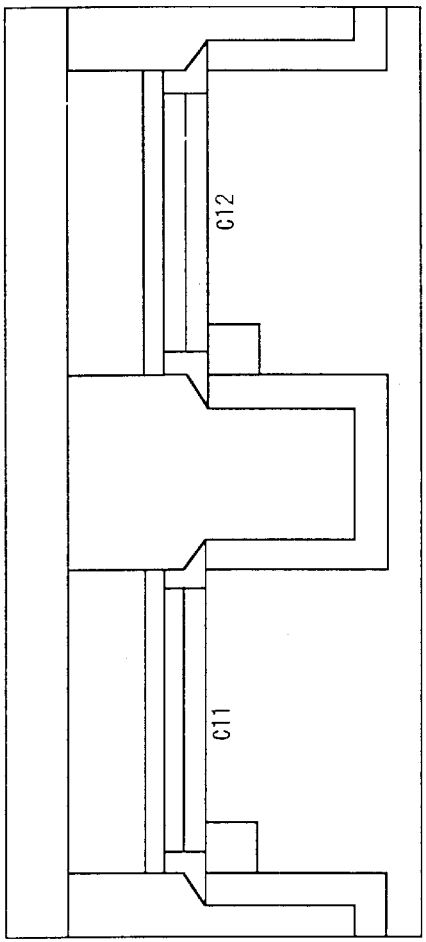
FIG. 27 is a schematic sectional view illustrating steps of a manufacturing method of the memory cell according to Embodiment 1 of the present invention.
Figure 28:
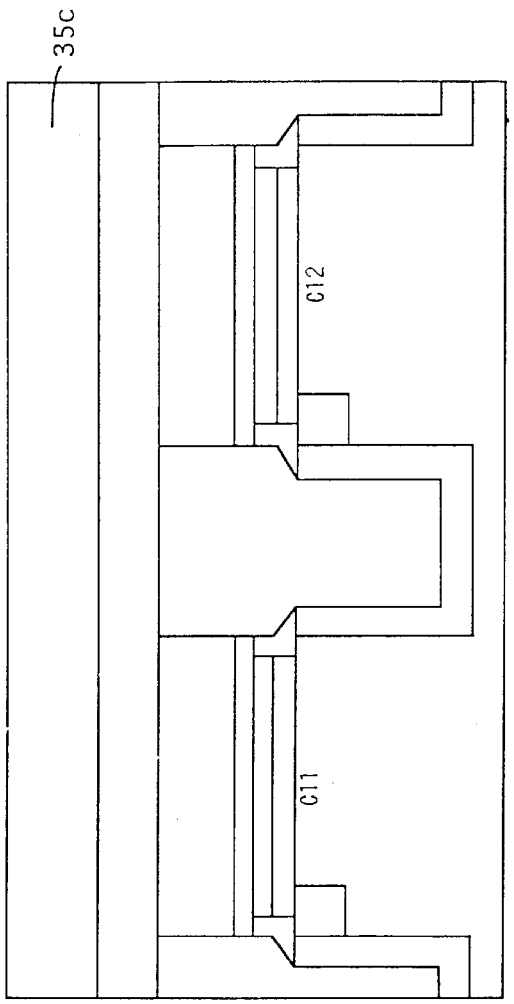
FIG. 28 is a schematic sectional view illustrating steps of a manufacturing method of the memory cell according to Embodiment 1 of the present invention.
Figure 29:
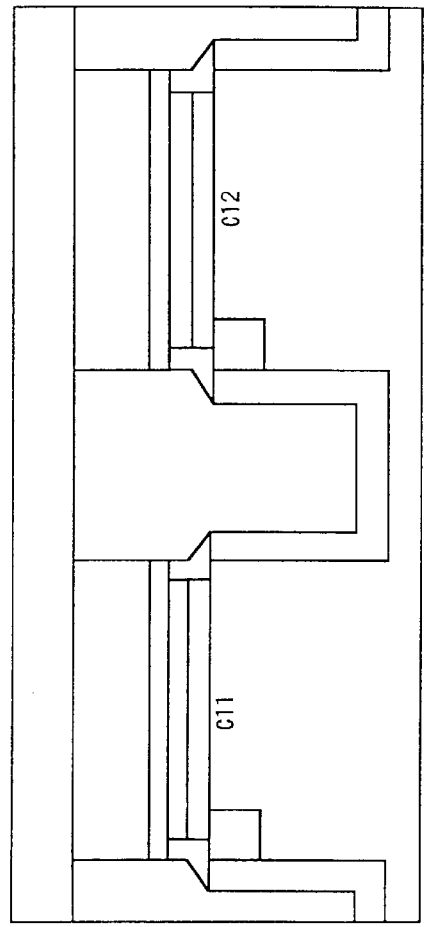
FIG. 29 is a schematic sectional view illustrating steps of a manufacturing method of the memory cell according to Embodiment 1 of the present invention.

Then, the nitride films 34 and 42 are removed with hot phosphoric acid or by chemical dry etching (see FIGS. 14 and 27). The oxide film 41 still remains in the region for forming the conductive layer.

Then, a resist mask 35c is formed to have an opening in the region for forming the memory cell and cover the region for forming the conductive layer. The oxide film 33 on the polysilicon layer 32a is removed by little dipping into a HF solution through the resist mask 35c (see FIGS. 15 and 28). In this step, since the etching rate of the HDP oxide film 43 is greater than that of the thermal oxide film, the edges of the HDP oxide film are tapered. The thus tapered shape facilitates the fabrication of the control gate and the floating gate in a later step.

Thereafter, a polysilicon layer 32b of 10–200 nm thick (e.g., 50 nm) is deposited. Using the resist mask 35c having an opening in a region other than a region for forming the floating gate in the memory cell region, the polysilicon layer 32b is patterned (see FIGS. 16 and 29). This step is performed to increase an overlapping area between the floating gate and the control gate. As a result, the gate capacitance coupling ratio increases and voltage consumption is lowered. This embodiment employs the polysilicon layer 32b for the above reason, but it may be omitted.

Figure 17:
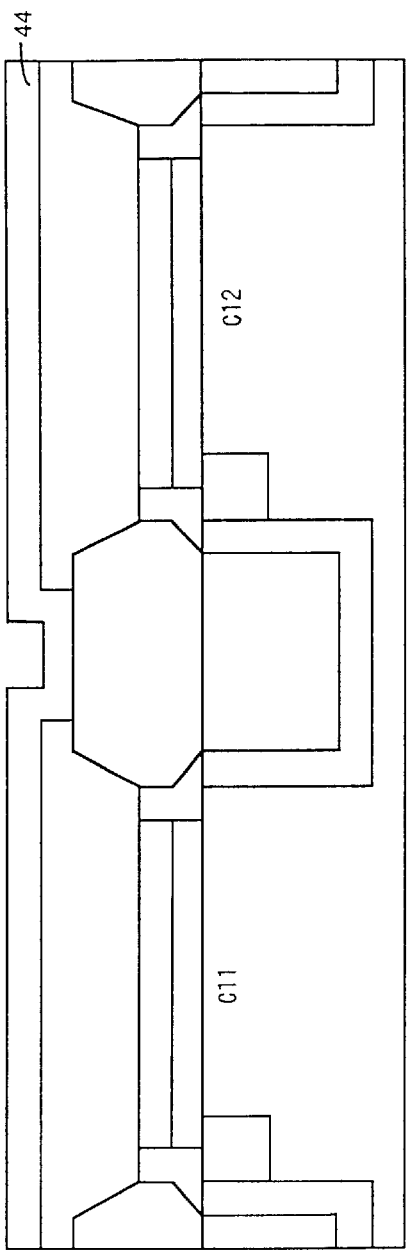
FIG. 17 is a schematic sectional view illustrating steps of a manufacturing method of the memory cell according to Embodiment 1 of the present invention.
Figure 18:
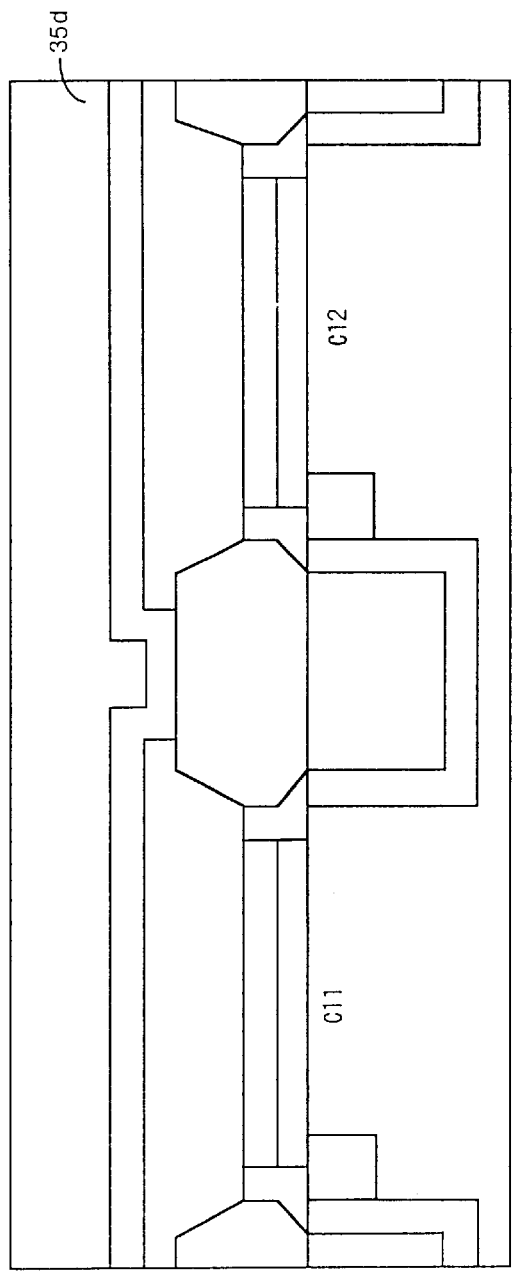
FIG. 18 is a schematic sectional view illustrating steps of a manufacturing method of the memory cell according to Embodiment 1 of the present invention.
Figure 19:
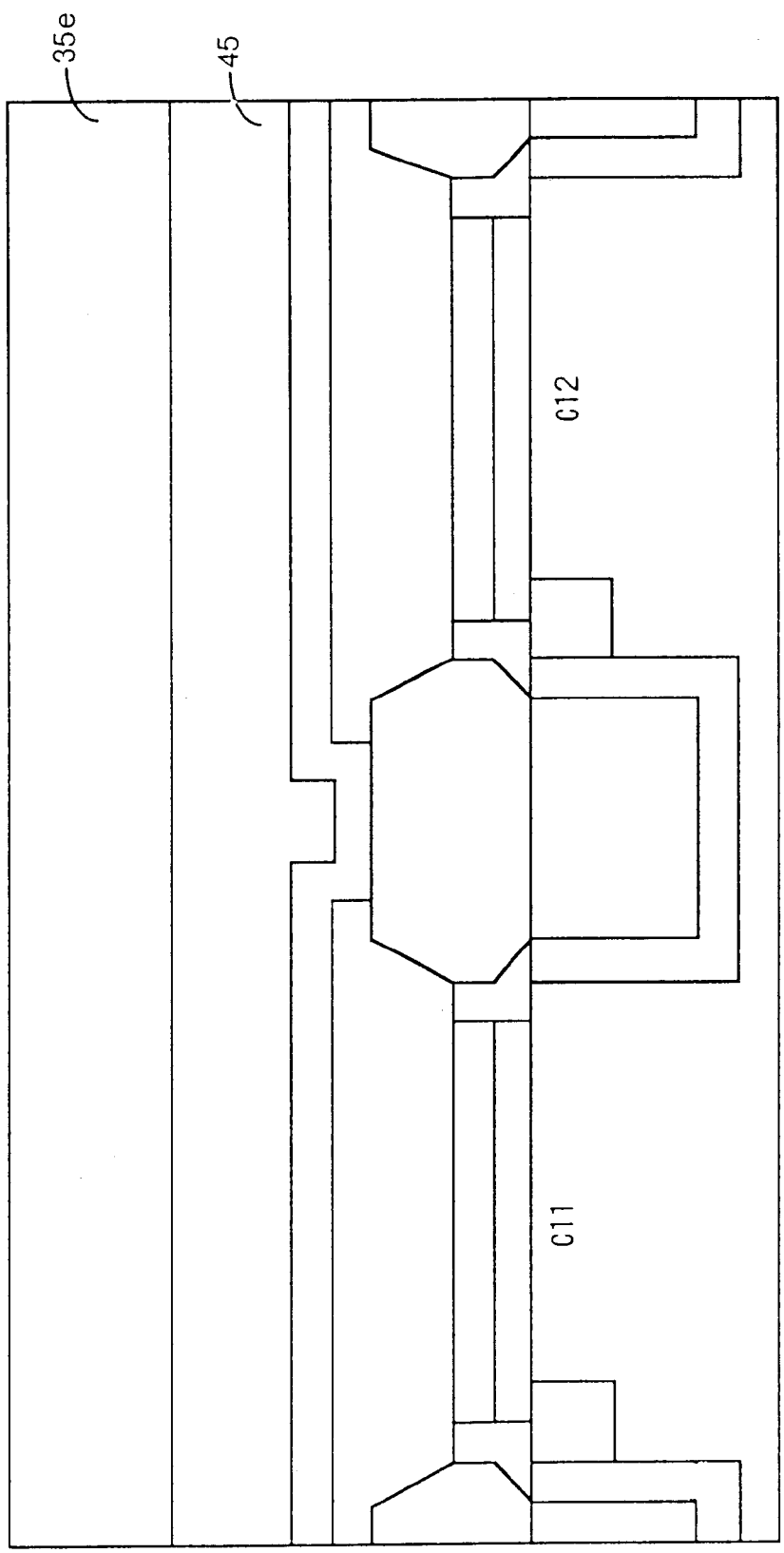
FIG. 19 is a schematic sectional view illustrating steps of a manufacturing method of the memory cell according to Embodiment 1 of the present invention.
Figure 22:
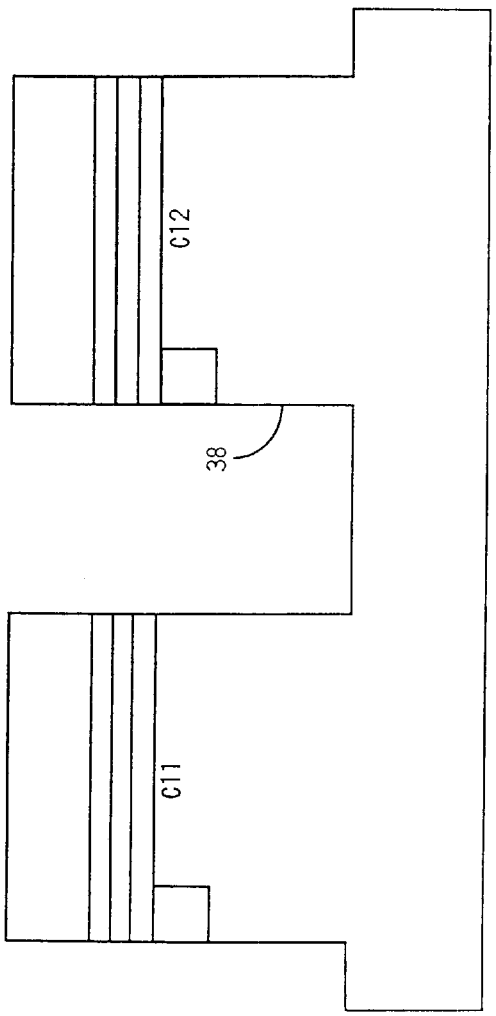
FIG. 22 is a schematic sectional view illustrating steps of a manufacturing method of the memory cell according to Embodiment 1 of the present invention.
Figure 23:
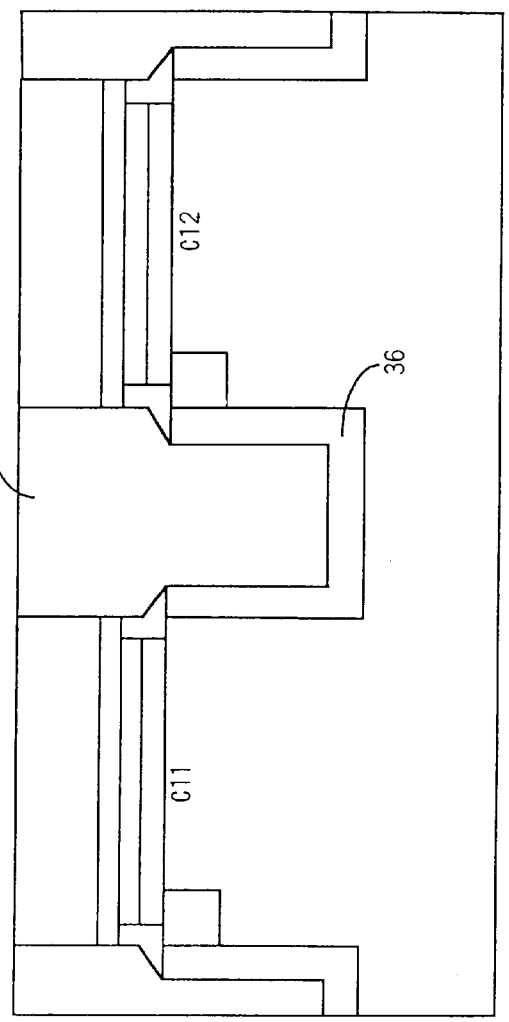
FIG. 23 is a schematic sectional view illustrating steps of a manufacturing method of the memory cell according to Embodiment 1 of the present invention.
Figure 24:
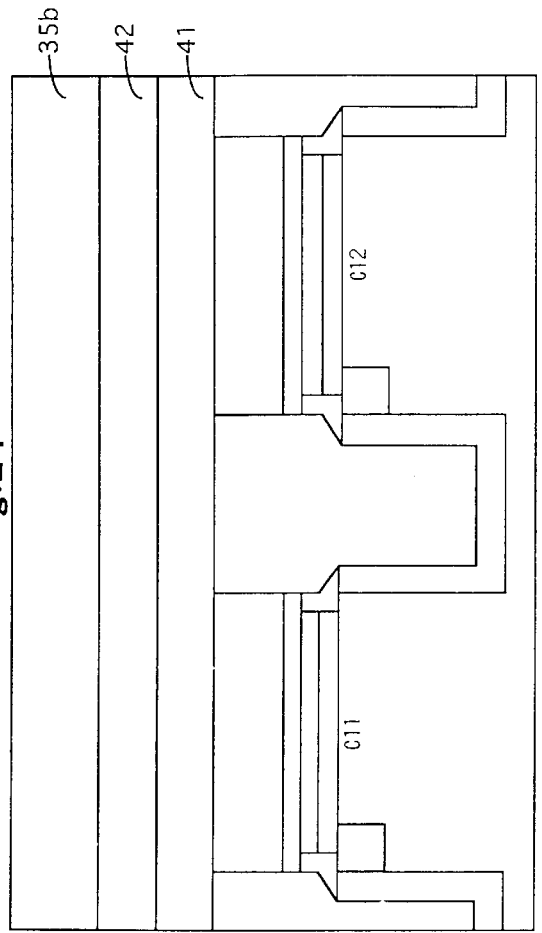
FIG. 24 is a schematic sectional view illustrating steps of a manufacturing method of the memory cell according to Embodiment 1 of the present invention.
Figure 25:
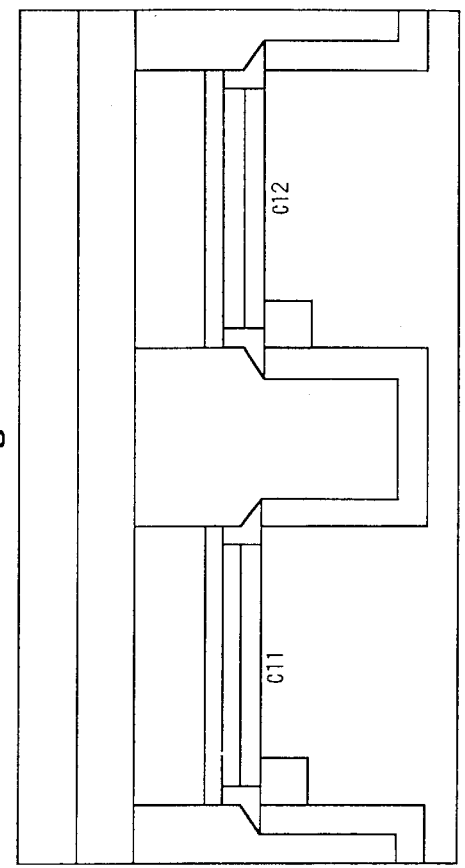
FIG. 25 is a schematic sectional view illustrating steps of a manufacturing method of the memory cell according to Embodiment 1 of the present invention.
Figure 26:
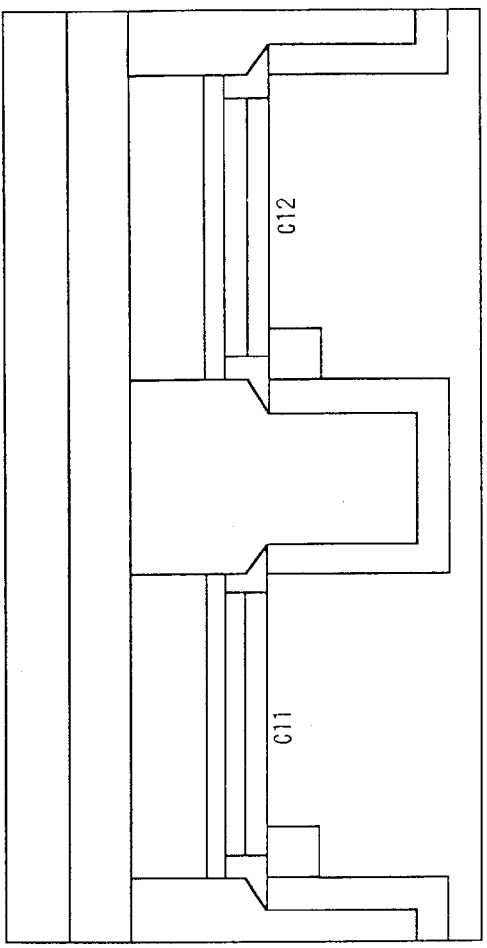
FIG. 26 is a schematic sectional view illustrating steps of a manufacturing method of the memory cell according to Embodiment 1 of the present invention.
Figure 30:
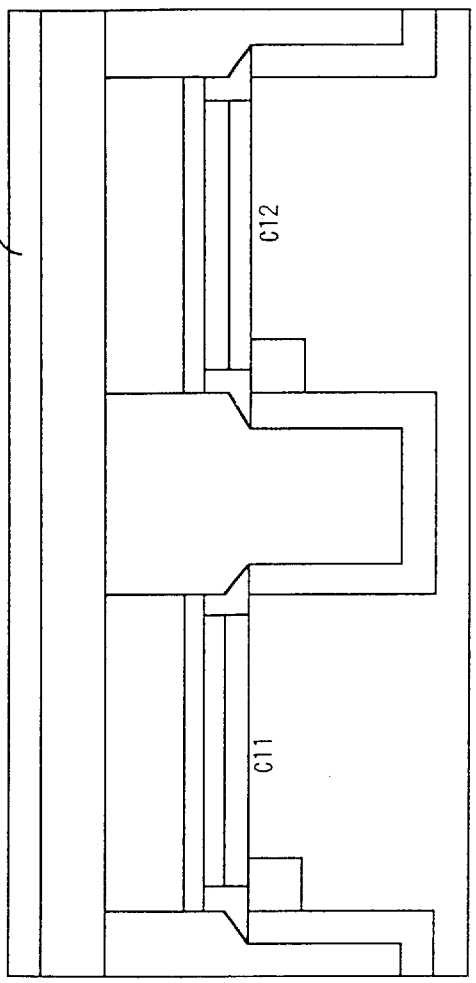
FIG. 30 is a schematic sectional view illustrating steps of a manufacturing method of the memory cell according to Embodiment 1 of the present invention.
Figure 31:
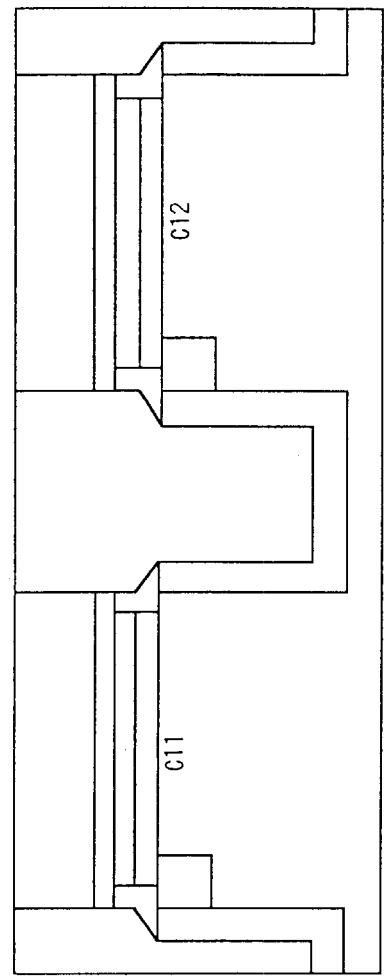
FIG. 31 is a schematic sectional view illustrating steps of a manufacturing method of the memory cell according to Embodiment 1 of the present invention.
Figure 32:
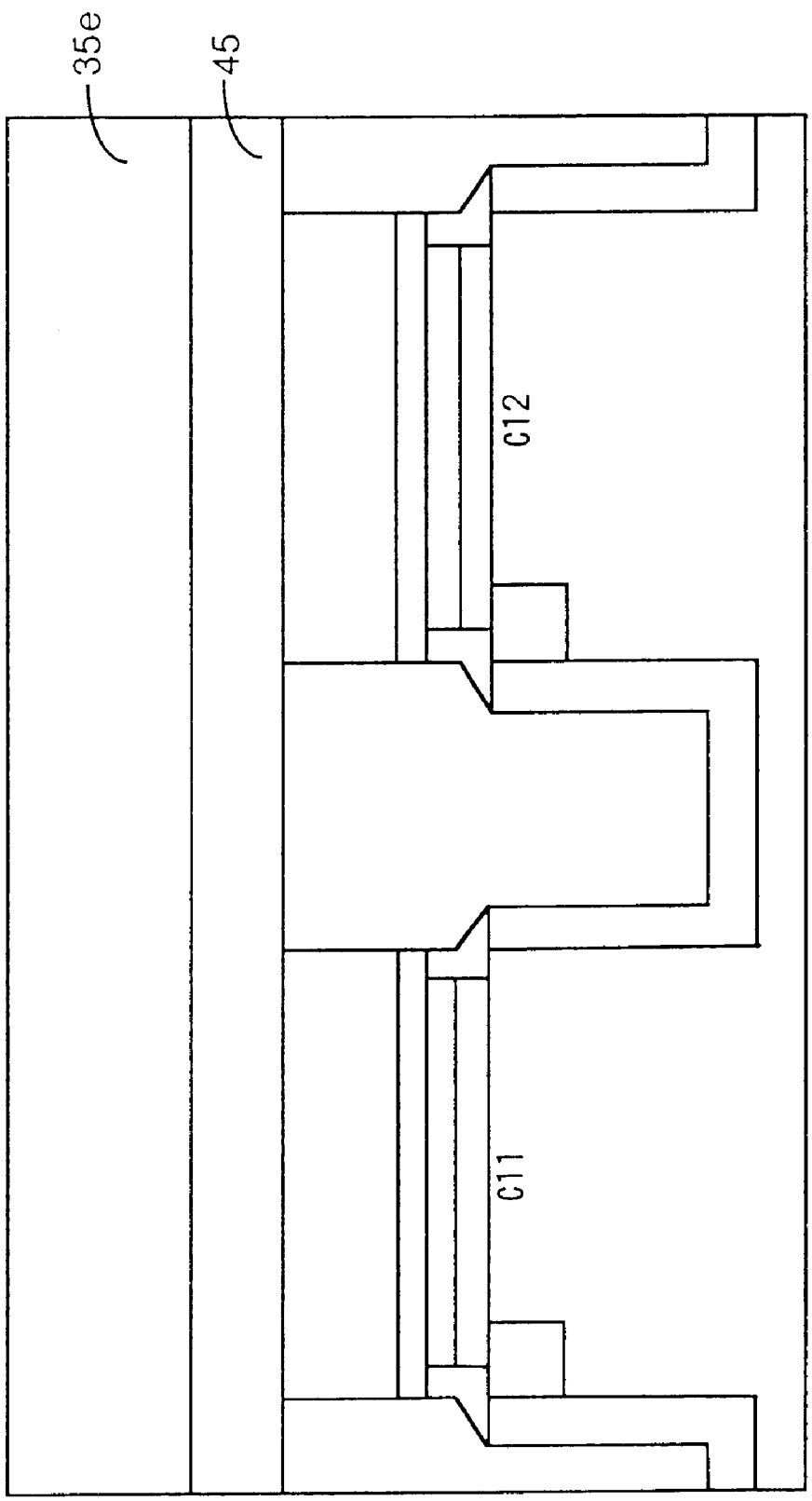
FIG. 32 is a schematic sectional view illustrating steps of a manufacturing method of the memory cell according to Embodiment 1 of the present invention.

After the resist mask 35c is removed, a third insulating film made of an ONO film 44 is deposited (see FIGS. 17 and 30).

Subsequently, a resist mask 35d is formed to cover the region for forming the memory cell and have an opening in the region for forming the conductive layer. Using the resist mask 35d, the ONO film 44 and the oxide film 42 are removed to expose the polysilicon layer 32a in the region for forming the conductive layer (see FIGS. 18 and 31).

After the resist mask 35d is removed, a polyside film 45 which will serve as the conductive layer is deposited. As a result, the polysilicon layer 32a in the region for forming the conductive layer and the polyside film 45 are electrically connected. Then, a resist mask 35e is formed to cover the regions for forming the conductive layer and the control gate. Using the resist mask 35e, the polyside film 45, the ONO film 44 and the polysilicon layers 32a and 32b are etched in sequence to form a floating gate and a control gate in self-alignment (see FIGS. 19 and 32).

In a final step, a protective film such as BPSG is deposited (not shown).

Through these steps, the cells constructing the cell array of the present invention are prepared.

Embodiment 2

Figure 33B:
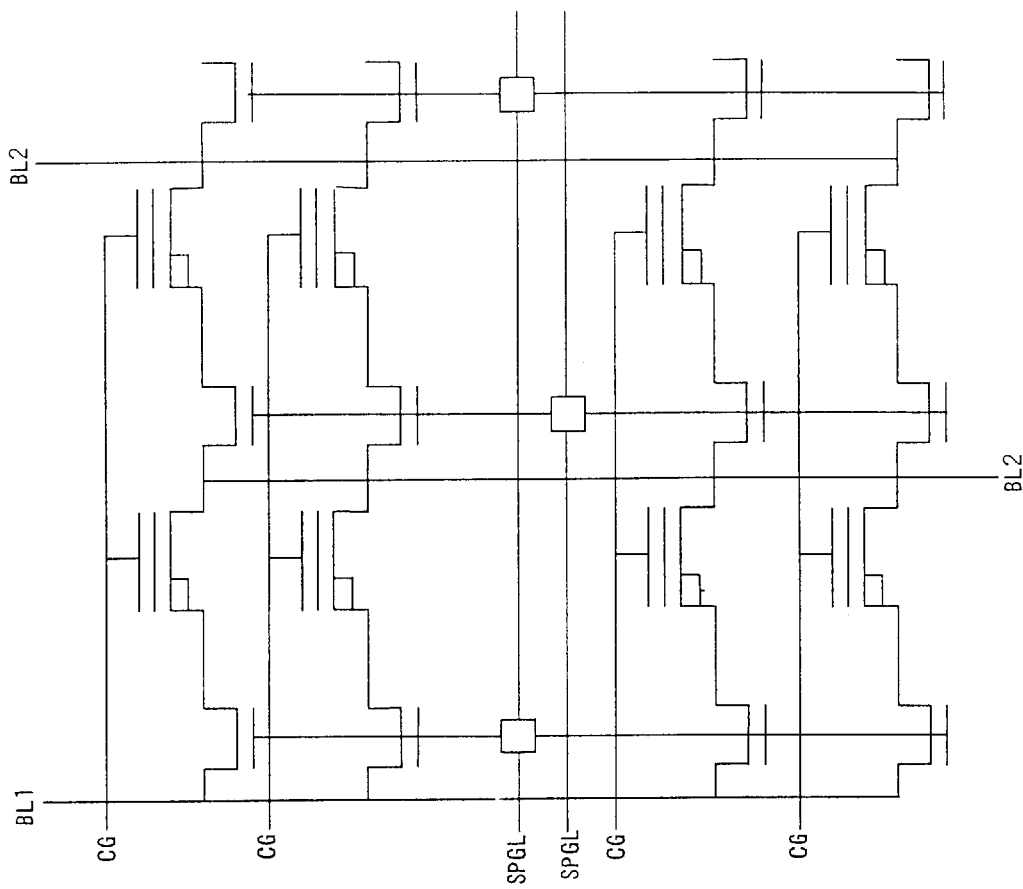
FIGS. 33(a) and 33(b) are a schematic plan view and an equivalent circuit diagram of the cell array according to Embodiment 2 of the present invention, respectively.
Figure 33A:
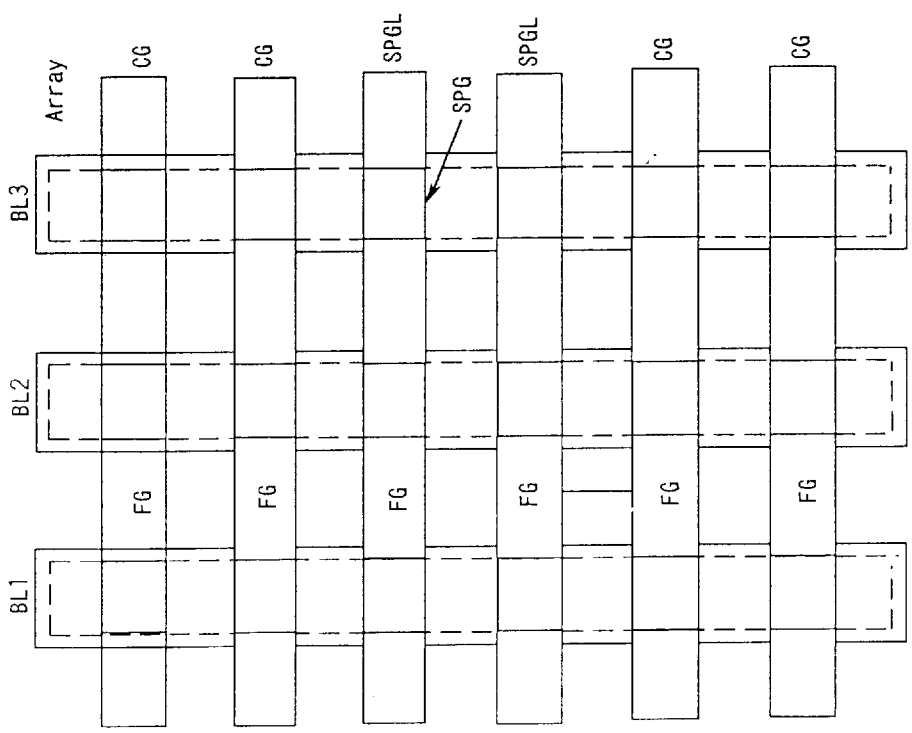
Figure 34:
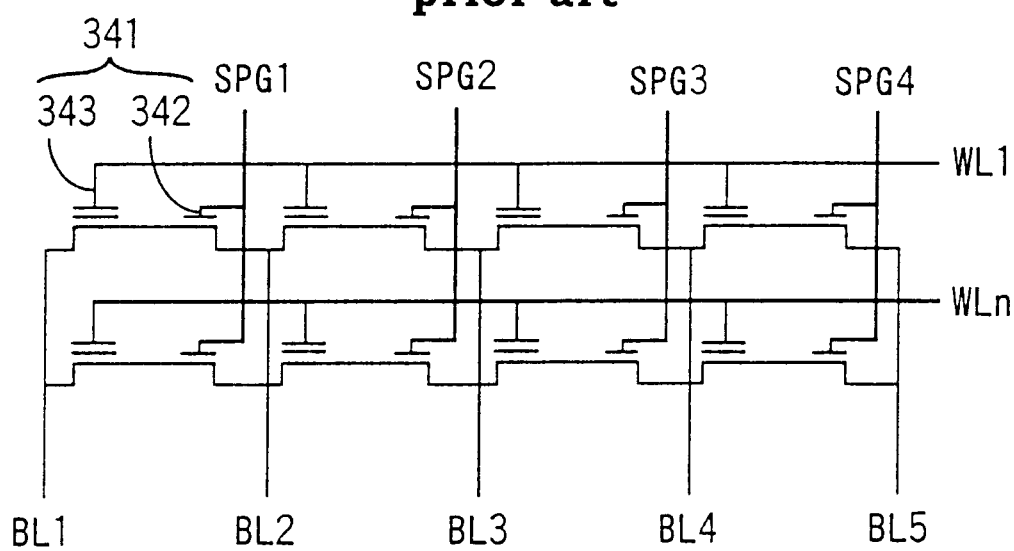
FIG. 34 is an equivalent circuit diagram of a cell array according to the prior art.

FIGS. 33(a) and 33(b) are a schematic plan view and an equivalent circuit diagram of the cell array shown in FIG. 2, respectively. In the cell array shown in FIG. 33(a), the SPGs commonly connected along the Y direction are commonly connected in the X direction on a column basis. According to the construction, the same voltage is applied to every other SPG arranged in the X direction.

The cells composed the cell array of Embodiment 2 may be the same as those used in Embodiment 1. Further, the manufacturing method of the cells may be the same as that of Embodiment 1 except that the formation of the polyside film 45 is carried out twice.

According to the present invention, a circuit controlling the SPGs is simplified to the same extent as a cell array controlled only by the word lines and the bit lines. Further, the scaling of the cells is prevented from being limited by the conductive layer commonly connected to the SPGs, which allows the reduction of the periphery circuit. Thus, the present invention is suited to obtain a cell array of large capacity.

What is claimed is:

1. A cell array comprising nonvolatile memory cells having;
    a floating gate formed on a semiconductor substrate with the intervention of a first insulating film;
    a split gate formed with the intervention of a second insulating film at a predetermined distance from the floating gate;
    a control gate formed at least on the floating gate with the intervention of a third insulating film; and
    an impurity diffusion layer formed in a surface layer of the semiconductor substrate and capacitively coupled with an edge of the floating gate on an opposite side to the split gate in an X direction in parallel with a channel direction;
    wherein two or more cells are arranged in matrix along the X direction and a Y direction vertical to the X direction,
    the floating gates and the split gates are alternately arranged in the X direction and the impurity diffusion layer of one cell is capacitively coupled with a split gate of another cell adjacent to said one cell in the X direction,
    the control gates of the cells arranged along the X direction are commonly connected along the X direction,
    the impurity diffusion layers of the cells arranged along the Y direction are commonly connected along the Y direction, and
    the split gates commonly connected along the Y direction are also commonly connected along the X direction through at least one conductive layer.

2. A cell array according to claim 1, wherein the conductive layer is comprised of one or two.

3. A method of operating a cell array to claim 1, wherein data reading is performed by applying a voltage to the conductive layer so that a split gate transistor comprising the split gate and two impurity diffusion layers arranged in the X direction of the split gate is maintained in an ON-state.

4. A method of operating a cell array of claim 1, wherein a voltage applied to the control gate at data reading is applied to the conductive layer.

5. A method of operating a cell array of claim 1, wherein data writing is performed by turning OFF a split gate transistor comprising the split gate and two impurity diffusion layers arranged in the X direction of the split gate so that tunnel electrons are injected from the substrate to the floating gate through a channel region.

6. A method of operating a cell array, wherein, after data writing is performed by the method of claim 5, the data is erased with use of FN tunnel current flowing between the floating gate and the semiconductor substrate or the floating gate and the impurity diffusion layer of a selected desired cell.

7. A method of operating a cell array of claim 1, wherein data reading is performed by turning OFF a split gate transistor comprising the split gate and two impurity diffusion layers arranged in the X direction of the split gate so that electrons are extracted from the floating gate to the impurity diffusion layer.

8. A method of operating a cell array, wherein, after data writing is performed by the method of claim 7, the data is erased with use of FN tunnel current flowing between the floating gate and the semiconductor substrate or the floating gate and the impurity diffusion layer of a selected desired cell.

9. A method of operating a cell array of claim 1, wherein data writing is performed by applying a voltage close to a threshold value of a split gate transistor comprising the split gate and two impurity diffusion layers arranged in the X direction of the split gate to the whole split gates of the split gate transistors so that electron are injected from the impurity diffusion layer of the split gate side to the floating gate.

10. A method of operating a cell array, wherein, after data writing is performed by the method of claim 9, the data is erased with use of FN tunnel current flowing between the floating gate and the semiconductor substrate or the floating gate and the impurity diffusion layer of a selected desired cell.

11. A cell array according to claim 1, wherein the conductive layer is comprised of a first conductive layer and a second conductive layer, the first conductive layer being arranged so that the split gates commonly connected along the Y direction are alternately commonly connected along the X direction and the second conductive layer being arranged so that the split gates other than those commonly connected thorough the first conductive layer are commonly connected in the X-direction.

12. A method of operating a cell array of claim 11, wherein data reading is performed by applying a voltage to the first conductive layer connected to a cell selected to read and grounding the second conductive layer connected to an unselected cell which is not read.

13. A method of operating a cell array, or claim 11, wherein data reading is performed in two steps of reading the cells whose split gates are commonly connected along the X direction through the first conductive layer and then reading the cells whose split gates are commonly connected along the X direction through the second conductive layer.

14. A method of operating a cell array of claim 11, wherein data writing is performed by applying a voltage to the first conductive layer connected to a cell selected to read to turn ON a split gate transistor comprising the split gate and two impurity diffusion layers arranged in the X direction of the split gate, and then a second conductive layer connected to an unselected cell which is not read is grounded so that electrons are injected from the impurity diffusion layer to the floating gate.

15. A method of operating a cell array of claim 11, wherein data writing is performed in two steps of writing to the cells whose split gates are commonly connected in the X direction through the first conductive layer and then writing to the cells whose split gates are commonly connected in the X direction through the second conductive layer.

16. A method of operating a cell array of claim 11, wherein data writing is performed by applying a voltage close to a threshold value of a split gate transistor comprising the split gate and two impurity diffusion layers arranged in the X direction of the split gate to a first conductive layer of a cell selected to read so as to turn ON the split gate transistor, and then a second conductive layer connected to an unselected cell which is not read is grounded so that electrons are injected from the impurity diffusion layer on a side near the split gate of the selected cell to the floating gate.

17. A method of operating a cell array wherein, after data writing is performed by the method of claim 16, the data is erased with use of FN tunnel current flowing between the floating gate and the semiconductor substrate or the floating gate and the impurity diffusion layer of a selected desired cell.

18. A method of operating a cell array of claim 11, wherein data writing is performed in two steps of writing to the cells whose split gates are commonly connected in the X direction through the first conductive layer and then writing to the cells whose split gates are commonly connected in the X direction through the second conductive layer.

19. A method of operating a cell array of wherein, after data writing is performed by the method of claim 18, the data is erased with use of FN tunnel current flowing between the floating gate and the semiconductor substrate or the floating gate and the impurity diffusion layer of a selected desired cell.

20. A method of operating a cell array of claim 11, wherein data writing is performed by applying a voltage to the whole split gates of the split gate transistors each comprising the split gate and two impurity diffusion layers arranged in the X direction of the split gate so that electrons are injected from the impurity diffusion layer to the floating gate.

21. A method of operating a cell array wherein, after data writing is performed by the method of claim 20, the data is erased with use of FN tunnel current flowing between the floating gate and the semiconductor substrate or the floating gate and the impurity diffusion layer of a selected desired cell.

* * * * *